US006303959B1

(12) United States Patent
Ratnam

(10) Patent No.: US 6,303,959 B1
(45) Date of Patent: Oct. 16, 2001

(54) SEMICONDUCTOR DEVICE HAVING REDUCED SOURCE LEAKAGE DURING SOURCE ERASE

(75) Inventor: Perumal Ratnam, Fremont, CA (US)

(73) Assignee: Alliance Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/375,751

(22) Filed: Aug. 25, 1999

(51) Int. Cl.$^7$ ................................................. H01L 29/76
(52) U.S. Cl. .................. 257/314; 257/314; 257/315; 257/381; 257/637; 257/639; 438/954
(58) Field of Search ................... 257/314, 315, 257/381, 385, 637, 639; 438/954

(56) References Cited

U.S. PATENT DOCUMENTS

| | | | |
|---|---|---|---|
| 5,120,671 | 6/1992 | Tang et al. ............................. | 437/43 |
| 5,470,773 | 11/1995 | Liu et al. ............................... | 437/43 |
| 5,570,314 | * 10/1996 | Gill ....................................... | 365/185.1 |
| 5,631,482 | * 5/1997 | Hong ..................................... | 257/326 |
| 5,675,161 | * 10/1997 | Thomas .................................. | 257/316 |
| 5,736,765 | * 4/1998 | Oh et al. ................................ | 257/321 |
| 5,757,051 | * 5/1998 | Wu et al. ................................ | 257/368 |
| 5,760,435 | * 6/1998 | Pan ........................................ | 257/314 |
| 5,877,425 | * 3/1999 | Ahn ....................................... | 257/321 |
| 5,925,906 | * 7/1999 | Tanaka ................................... | 257/314 |
| 5,981,993 | * 11/1999 | Cho ....................................... | 257/311 |
| 6,018,178 | * 1/2000 | Sung ...................................... | 257/316 |
| 6,028,336 | * 2/2000 | Yuan ...................................... | 257/315 |

FOREIGN PATENT DOCUMENTS

405067791   *   3/1993   (JP) ..................................... 257/314

OTHER PUBLICATIONS

Chang, et al., "Corner–Field Induced Drain Leakage In Thin Oxide MOSFETs," *IEDM Technical Digest*, 31.2, pp. 714–717 (1987).

Kume, et al., "A Flash–Erase EEPROM Cell With An Asymmetric Source and Drain Structure," *IEDM Technical Digest*, 25.8, pp. 560–563 (1987).

Yokozawa, et al., "Low–Field–Stress Erasing Scheme for Highly–Reliable Flash Memories," NEC ULSI Device Development Laboratories, 24 pages, Feb. 12, 1997.

* cited by examiner

*Primary Examiner*—Eddie Lee
*Assistant Examiner*—Edgardo Ortiz
(74) *Attorney, Agent, or Firm*—Beyer Weaver & Thomas, LLP

(57) ABSTRACT

In one aspect, the current invention provides a method for reducing the source leakage of a semiconductor device. The method comprises the steps of stacked gate etch, thin oxide formation, SAS etch, spacer formation and source implant on the semiconductor substrate.

In a second aspect, the current invention provides another method for reducing the source leakage of a semiconductor device. The method comprises the steps of stacked gate etch, first oxide layer formation, first source implant, annealing, SAS etch, second oxide layer formation, spacer formation, and second source implant.

In yet another aspect, the current invention provides a novel semiconductor device. The semiconductor device is comprised of a stacked gate provided on a portion of a semiconductor substrate, a first oxide layer appended to the stacked gate, a second oxide layer formed on the first oxide layer and a spacer formed on the second oxide layer. The semiconductor device also has a doped source region having a first doped region disposed under the edge of the stacked gate and a second doped region disposed at the edge of the doped source region under the stacked gate. The second doped region has a higher concentration of dopant than the first doped region, which reduces source leakage of the semiconductor device.

17 Claims, 15 Drawing Sheets

SEMICONDUCTOR DEVICE HAVING REDUCED SOURCE LEAKAGE DURING SOURCE ERASE

BACKGROUND OF THE INVENTION

1. Field of the Invention

The present invention relates to flash EPROM cells and methods for their construction. More particularly, the current invention relates to reducing leakage during source erase of flash EPROM cells. More specifically, the present invention provides new process techniques that reduce source leakage during source erase of flash EPROM cells. The current invention also provides novel semiconductor devices with a differentially doped source region that reduces leakage during source erase.

2. Discussion of Related Art

Erasable programmable read-only memory (EPROM) is a form of non-volatile memory. Non-volatile memory devices retain information when power to the device is interrupted and thus are important in the design of wireless and portable electronic devices. Non-volatile storage choices range from mask read-only memory (ROM), ultraviolet EPROM (UV-EPROM), flash EPROM and electrically erasable EPROM (EEPROM).

EPROM devices typically lack the density of ROM disks but are more flexible since coded changes can be accommodated. EPROM devices offer the further advantage of rapid access since reading and writing to these types of devices is not delayed by the latency periods characteristic of ROM devices.

Flash EPROM offers some of the advantages of EEPROM with the lower cost of UV-EPROM. All forms of EPROM use electrical injection methods to program individual memory cells but differ in the method of memory cell erasure. Ultraviolet light irradiation is used to erase UV-EPROM memory cells. This method is non-selective and requires removal of memory cells from the system for erasure. EEPROM systems use Fowler-Nordheim tunneling to erase single cells which offers reprogramming flexibility, high density and convenience, since removal of memory cells from the device is not required for erasure.

Flash EPROM also uses Fowler-Nordheim tunneling for non-selective memory cell erasure. Thus, flash EPROM provides the convenience and high density of EEPROM with the low cost of conventional UV-EPROM. Therefore, flash EPROM has become the storage method of choice in many portable consumer devices such as cell phones and hand held personal computers.

Two different methods, which employ Fowler-Nordheim tunneling, are typically used to erase flash EPROM cells. In channel or substrate erase, a positive bias of about 10.0 V is applied to the substrate of the memory cell. Similarly, a negative bias of about −5.0 V is applied to the gate of the memory cell. Electron tunneling from the gate to the substrate then erases the memory cell. Channel erase requires source isolation by the triple well process, which is complicated and expensive.

Source erase is similar to substrate erase except that a positive bias of about 5.0 V is applied to the source of the memory cell while a negative bias of about −10.0 V is applied to the gate of the memory cell. Since source erase does not require source isolation by the triple well process it is simpler and less expensive to implement than channel erase.

However, a significant problem with source erase of flash EPROM cells is source diode leakage to the substrate during erasure. Source leakage lengthens the time required to erase a flash EPROM and degrades performance. Source diode leakage must be minimized to increase source erase speed.

Three different mechanisms contribute to source diode leakage during source erase. Thermal leakage, which is intrinsic to any diode, is small and independent of electric field. Avalanche multiplication is electric field dependent and can become very large if the cell is not optimized during fabrication.

Band to band tunneling leakage is a fundamental problem with source erase (C. Chang et al., *Tech. Dig. IEDM,* 714, 1987; H. Kume et al., *Tech. Dig. IEDM,* 560, 1987). Band to band leakage wastes power since some of the diode current is dissipated in the substrate during erasure. Furthermore, constant source voltage is difficult to maintain in the presence of this type of leakage, which places significant demand on the charge pump capacitor. Thus, the difficulties caused by band to band leakage in generating and maintaining the voltage required to erase the device are frequently the limiting factor in source erasing flash cells.

The contour of the junction profile at the source edge under the stacked gate edge in flash EPROM cells strongly influences band to band tunneling. This may be best understood with reference to a prior art process typically used in the fabrication of flash EPROM cells, which is depicted in FIGS. 1–3.

FIG. 1 illustrates a partially fabricated semiconductor device 100 after stack etch. A pair of stacked gates 112 are disposed on a semiconductor substrate 102. Stacked gates 112 are comprised of a tunnel oxide layer 104, a first polysilicon layer 106, an ONO layer 108 and a second polysilicon layer 110. The partially fabricated semiconductor device 100 can be made by conventional methods known to one of skill in the semiconductor arts.

FIG. 2A illustrates the partially fabricated semiconductor device of FIG. 1 after masking, self-aligned source (SAS) etch and mask removal (Tang et al., U.S. Pat. No. 5,120, 671). These processing steps are conventional and are well known to one of skill in the semiconductor arts.

SAS etch connects source regions between adjacent cells after stacked gate formation. More specifically, SAS etch etches field oxide regions, which are used to isolate the active regions of flash EPROM cells. Consequently, the source region, formed between field oxide regions of adjacent memory cells, is self-aligned with both the polysilicon word line and the field oxide region. Self-alignment of the source region with the polysilicon word line and the field oxide region increases the density and reduces the cell size of a memory cell. Thus, SAS etch increases the performance and cost-effectiveness of flash EPROM cells.

A significant problem with SAS etch is over etching of the semiconductor substrate 102 at region 116. Note that region 116 of the semiconductor substrate 102, which was exposed to SAS etch, is not level with the stacked gate edge. Contrastingly, regions 115 of the semiconductor substrate which were not exposed to SAS etch are level with the stacked gate edge.

More importantly, the SAS etch creates a gouge in the semiconductor substrate at regions 118 in FIG. 2A, which underlie the edge of stacked gates 112. Furthermore, the integrity of tunnel oxide layer 104 is affected since the stacked gate edge is exposed to the SAS etch conditions. FIG. 2B is an enlarged view of region 118, which illustrates the damage caused by SAS etch. Note that a portion of tunnel oxide layer 104 is etched under layer 106. The undercutting of semiconductor substrate 102 relative to the stacked gate edge 120 significantly damages the tunnel oxide layer 104. The ragged edge of the semiconductor substrate at 122 affects the uniformity of the subsequent ion implant to create the source region.

FIG. 3 illustrates the partially fabricated semiconductor device of FIG. 2 after SAS masking, source implantation, annealing and removal of the SAS mask. These conventional processing steps provide the source lines in a semiconductor device. Source region 124 has been formed under silicon surface 116. However, since the edge of the source region under the stacked gate 112 was damaged during SAS etch the implant is not uniform. The non-uniform implant in source region 124 leads to non-uniform erase in the flash memory array which is caused by an insufficient dopant dose in the source overlap region with the stacked gates 112. Furthermore, the non-uniform implant in source region 124 leads to excessive leakage caused by band to band tunneling, causing random failure in the array.

Nevertheless, it has become apparent that as flash EPROM cells shrink in size and increase in density that other methods of reducing source diode leakage are necessary. Thus, what is needed are efficient process methods that minimize band to band tunneling leakage caused by SAS etch.

SUMMARY OF THE INVENTION

The present invention addresses this need by providing new process methods that minimize source diode leakage. More specifically, the current invention reduces band to band tunneling leakage caused by SAS etch.

In one aspect, the current invention provides a method for reducing the source leakage of a semiconductor device. The method comprises providing a an etched stacked gate disposed on a semiconductor substrate, forming a thin oxide layer on the stacked gate, SAS etch, forming a spacer on the thin oxide layer and performing a source implant on the semiconductor substrate.

The thin oxide layer is formed by deposition and anisotropic etch of thin oxide. The SAS etch comprises the steps of SAS masking of the semiconductor device, field oxide etch and removing the SAS mask. The spacer may be formed by depositing a spacer layer and anisotropically etching the spacer layer. The source implant may be performed by SAS masking of the semiconductor device, implanting the source, annealing and removing the SAS mask. Preferably, the source implant is a phosphorus implant.

In one embodiment, the implanted source region has a first doped region disposed under the edge of the stacked gate and a second doped region disposed at the edge of the doped source region under the stacked gate. The second doped region has a higher concentration of dopant than the first doped region, which reduces source leakage of the semiconductor device. In a more specific embodiment, the second doped region has a dopant concentration of about $5 \times 10^{19}$ atoms/cm$^3$ and the first doped region has a dopant concentration of about $1 \times 10^{19}$ atoms/cm$^3$.

In another aspect, the current invention provides another method for reducing the source leakage of a semiconductor device. The method comprises providing an etched stacked gate disposed on a semiconductor substrate, forming a first oxide layer on the stacked gate, performing a first source implant, annealing, SAS etch, forming a second oxide layer on the first oxide layer, forming a spacer on the second oxide layer and performing a second source implant on the semiconductor substrate. Preferably, the first source implant is a phosphorus implant.

In one embodiment, the first oxide layer is between about 50 Å and about 100 Å. In another embodiment, the second oxide layer is between about 200 Å and about 500 Å.

In yet another aspect, the current invention provides a novel semiconductor device. The semiconductor device is comprised of a semiconductor substrate, a stacked gate provided on a portion of the semiconductor substrate, a first oxide layer provided on the edge of the stacked gate and a spacer provided on the first oxide layer. The semiconductor device also has a doped source region having a first doped region disposed under the edge of the stacked gate and a second doped region disposed at the edge of the doped source region under the stacked gate. The second doped region has a higher concentration of dopant than the first doped region, which reduces source leakage of the semiconductor device. Preferably, the doped source region is doped with phosphorus.

In one embodiment, the second doped region has a dopant concentration of about $5 \times 10^{19}$ atoms/cm$^3$ and the first doped region has a dopant concentration of about $1 \times 10^{19}$ atoms/cm$^3$. In another embodiment, the stacked gate is comprised of a tunnel oxide layer disposed on the semiconductor substrate, a first polysilicon layer disposed on the tunnel oxide layer, a ONO layer disposed on the first polysilicon layer and a second polysilicon layer disposed on the oxide layer. Preferably, the tunnel oxide layer is between about 60 Å and about 100 Å. In one embodiment, the first polysilicon layer is between about 500 Å and about 1500 Å. In another embodiment, the second polysilicon layer is between about 1000 Å and about 3000 Å. In yet another embodiment, the ONO layer is between about 120 Å and about 200 Å. Preferably, the channel length of the semiconductor device is between about 0.25 μm and about 0.50 μm.

In a final aspect, the current invention provides another novel semiconductor device. The semiconductor device is comprised of a semiconductor substrate, a stacked gate provided on a portion of the semiconductor substrate, a first oxide layer provided on the edge of the stacked gate, a second oxide layer provided on the first oxide layer and a spacer provided on the second oxide layer. The semiconductor device also has a doped source region having a first doped region disposed under the edge of the stacked gate and a second doped region disposed at the edge of the doped source region under the stacked gate. The second doped region has a higher concentration of dopant than the first doped region, which reduces source leakage of the semiconductor device. Preferably, the doped source region is doped with phosphorus.

In one embodiment, the second doped region has a dopant concentration of about $5 \times 10^{19}$ atoms/cm$^3$ and the first doped region has a dopant concentration of about $1 \times 10^{19}$ atoms/cm$^3$. In another embodiment, the stacked gate is comprised of a tunnel oxide layer disposed on the semiconductor substrate, a first polysilicon layer disposed on the tunnel oxide layer, a ONO layer disposed on the first polysilicon layer and a second polysilicon layer disposed on the oxide layer.

BRIEF DESCRIPTION OF THE DRAWINGS

The invention will be better understood by reference to the following description taken in conjunction with the accompanying drawings in which.

DETAILED DESCRIPTION OF THE PREFERRED EMBODIMENTS

Reference will now be made in detail to preferred embodiments of the invention. Examples of preferred embodiments are illustrated in the accompanying drawings. While the invention will be described in conjunction with the preferred embodiments, it will be understood that it is not intended to limit the invention to those preferred embodiments. To the contrary, it is intended to cover alternatives, modifications, and equivalents as may be included within the spirit and scope of the invention as defined by the appended claims.

Figure 1:
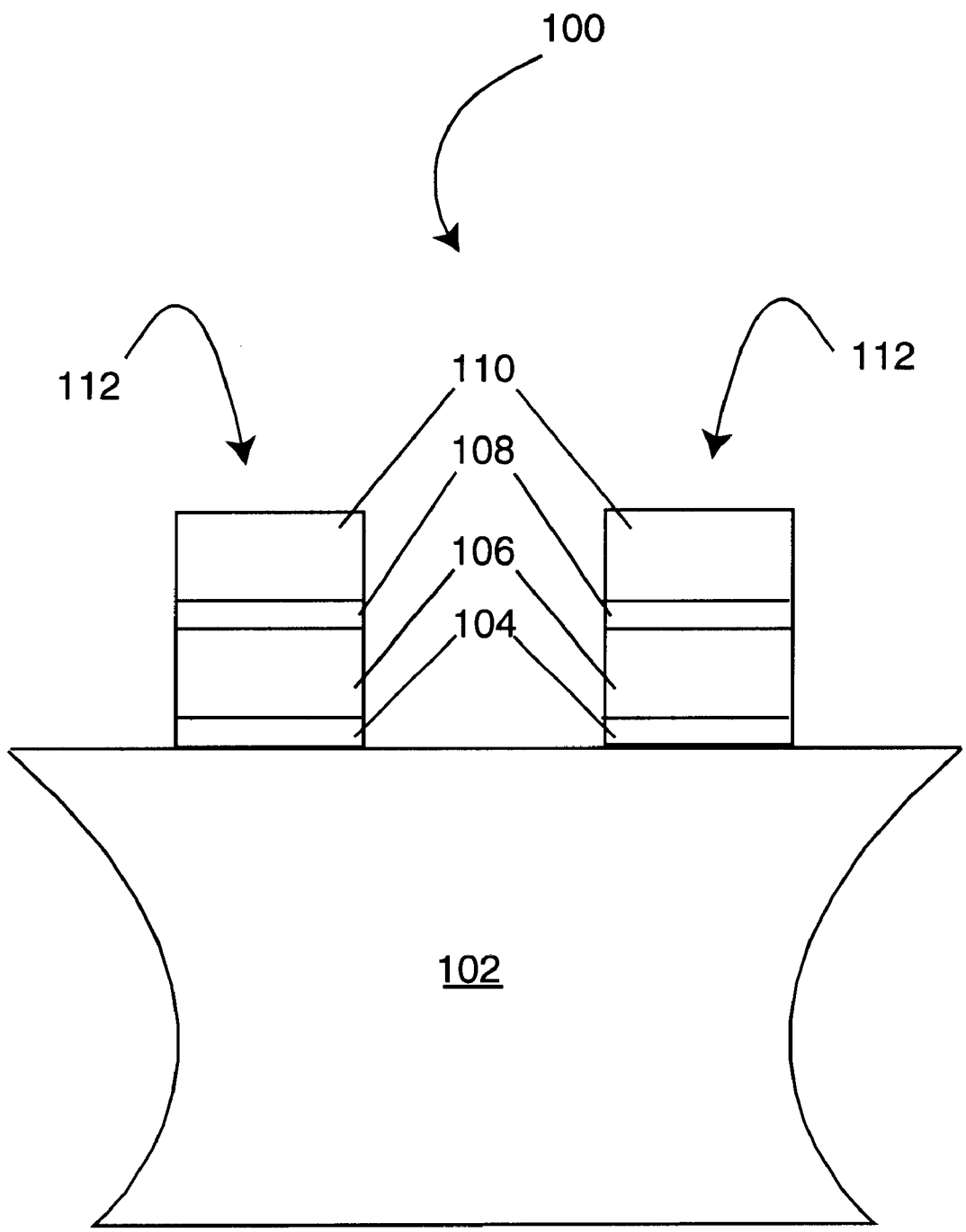
FIG. 1 illustrates a partially fabricated semiconductor device after stack etch.
Figure 2A:
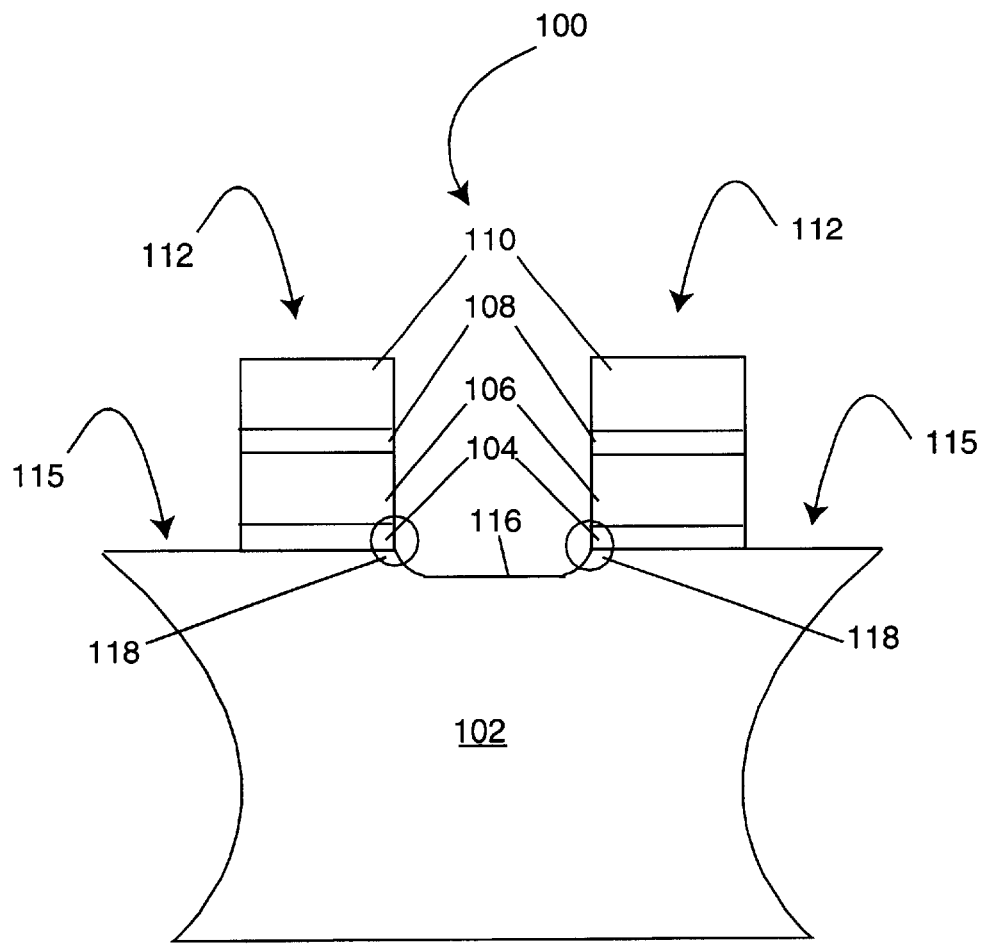
FIG. 2A illustrates the partially fabricated semiconductor device of FIG. 1 after SAS masking, SAS etch and SAS mask removal.
Figure 2B:
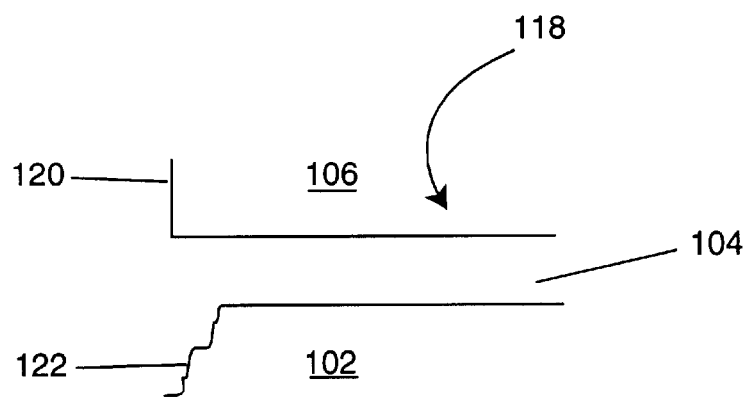
FIG. 2B illustrates an enlarged view of region 118 depicted in FIG. 2A.
Figure 3:
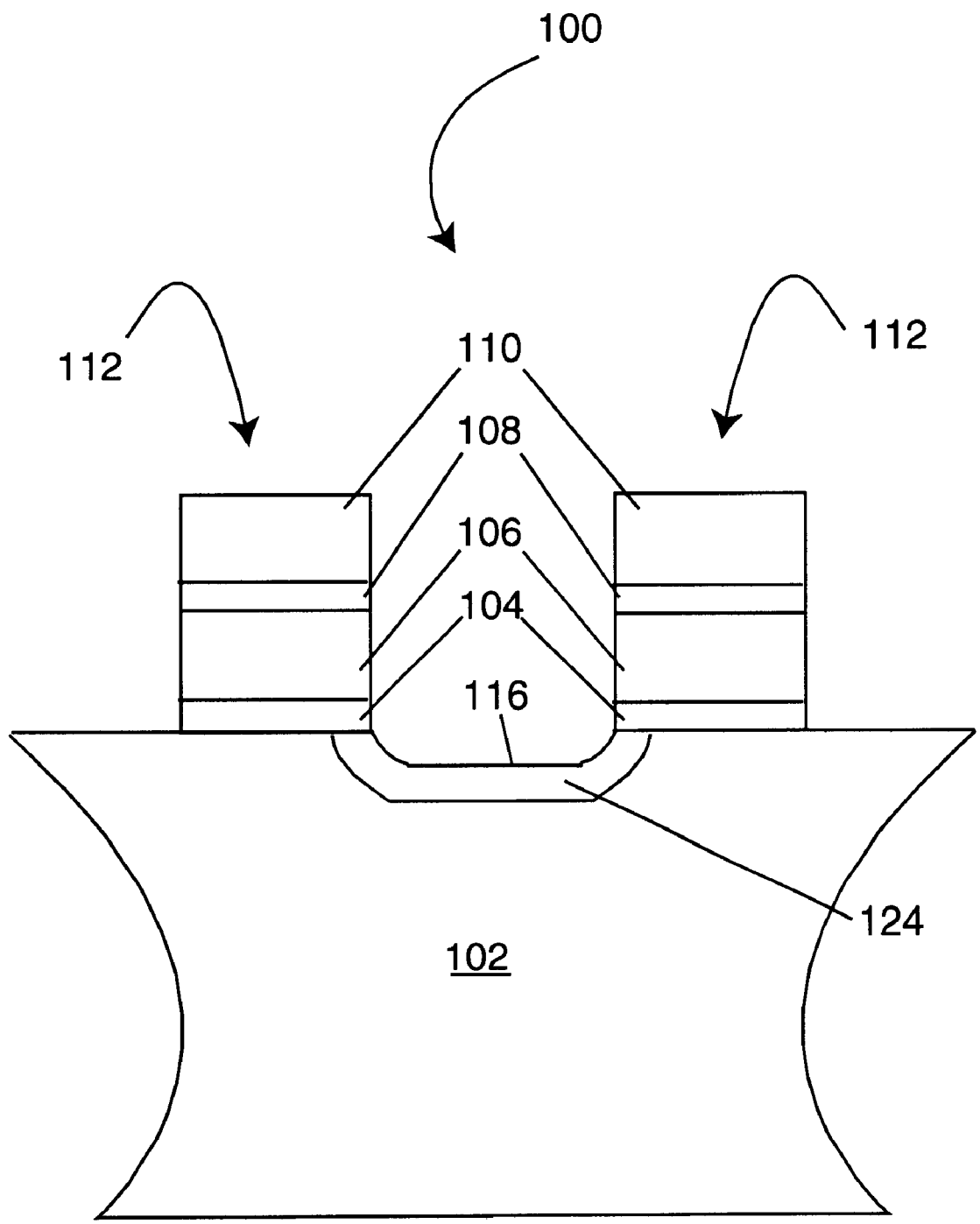
FIG. 3 illustrates the partially fabricated semiconductor device of FIG. 2A after SAS masking, source implantation, annealing and SAS mask removal.
Figure 4:
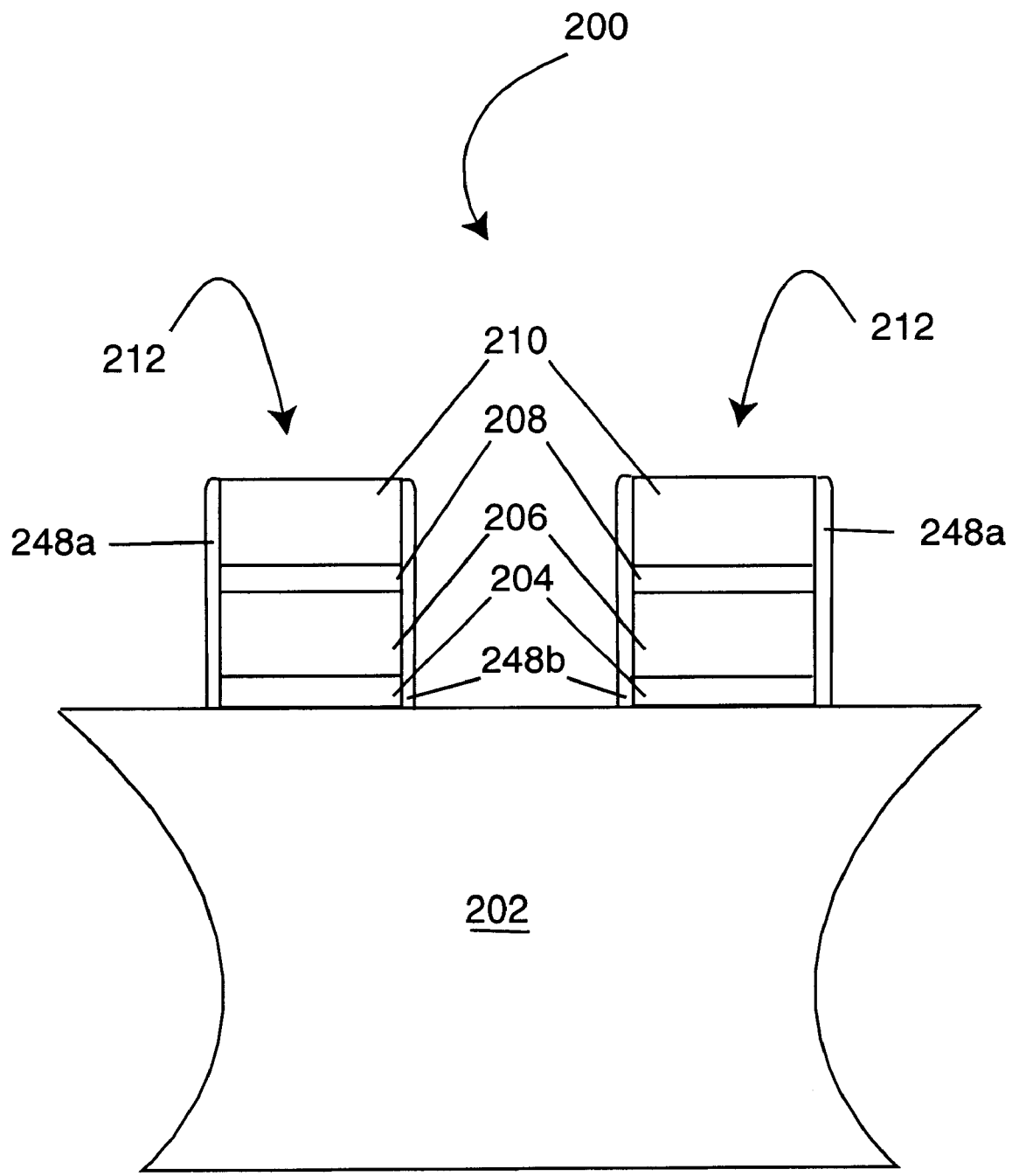
FIG. 4 illustrates a partially fabricated semiconductor device.

One embodiment of the current invention begins with the partially fabricated semiconductor device 200 shown in FIG. 4. Stacked gates 212, formed by stack etch under conventional conditions, are disposed on semiconductor substrate 202. In one embodiment, the semiconductor substrate 202 is a uniformly lightly p-doped single crystal silicon wafer. The channel length of the partially fabricated semiconductor device may be between about 0.25 μm and about 0.50 μm. Stacked gates 212 are comprised of a tunnel oxide layer 204, a first polysilicon layer 206, an ONO layer 208 and a second polysilicon layer 210. In the described embodiment, the tunnel oxide layer may be between 60 Å and about 100 Å, the first polysilicon layer may be between about 500 Å and about 1500 Å, the ONO layer may be between about 120 Å and about 200 Å and the second polysilicon layer may be between about 1000 Å and about 3000 Å.

Thin oxide layers 248a and 248b, which are appended to the edges of stacked gates 212, are formed after stack etch by deposition and anisotropic etch of thin oxide. In the described embodiment, thin oxide layers 248a and 248b may be between about 100 Å and about 500 Å. The thin oxide layer ensures good sidewall sealing for the ONO layer 208 and tunnel oxide layer 204. The thin oxide layer is sometimes called the seal oxide.

Figure 5:
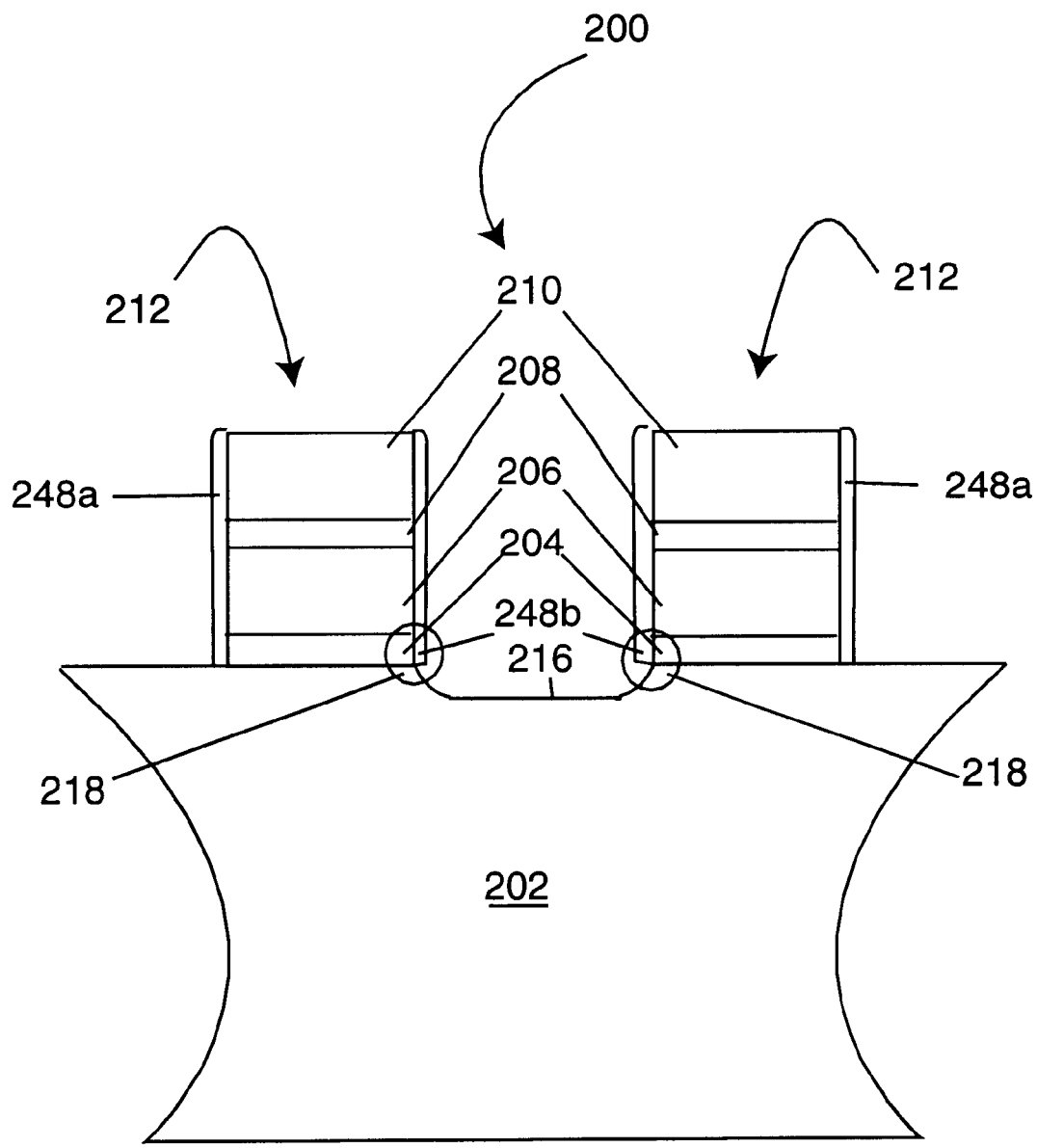
FIG. 5 illustrates the partially fabricated semiconductor device of FIG. 4 after SAS etch.

As illustrated in FIG. 5, the partially fabricated semiconductor substrate 200 has been subjected to SAS etch. Note that region 216, which was exposed to SAS etch, is not level with the stacked gate edge. More importantly, the SAS etch has gouged the semiconductor substrate at regions 218 in FIG. 4, which are adjacent to the edge of stacked gates 212.

Figure 6:
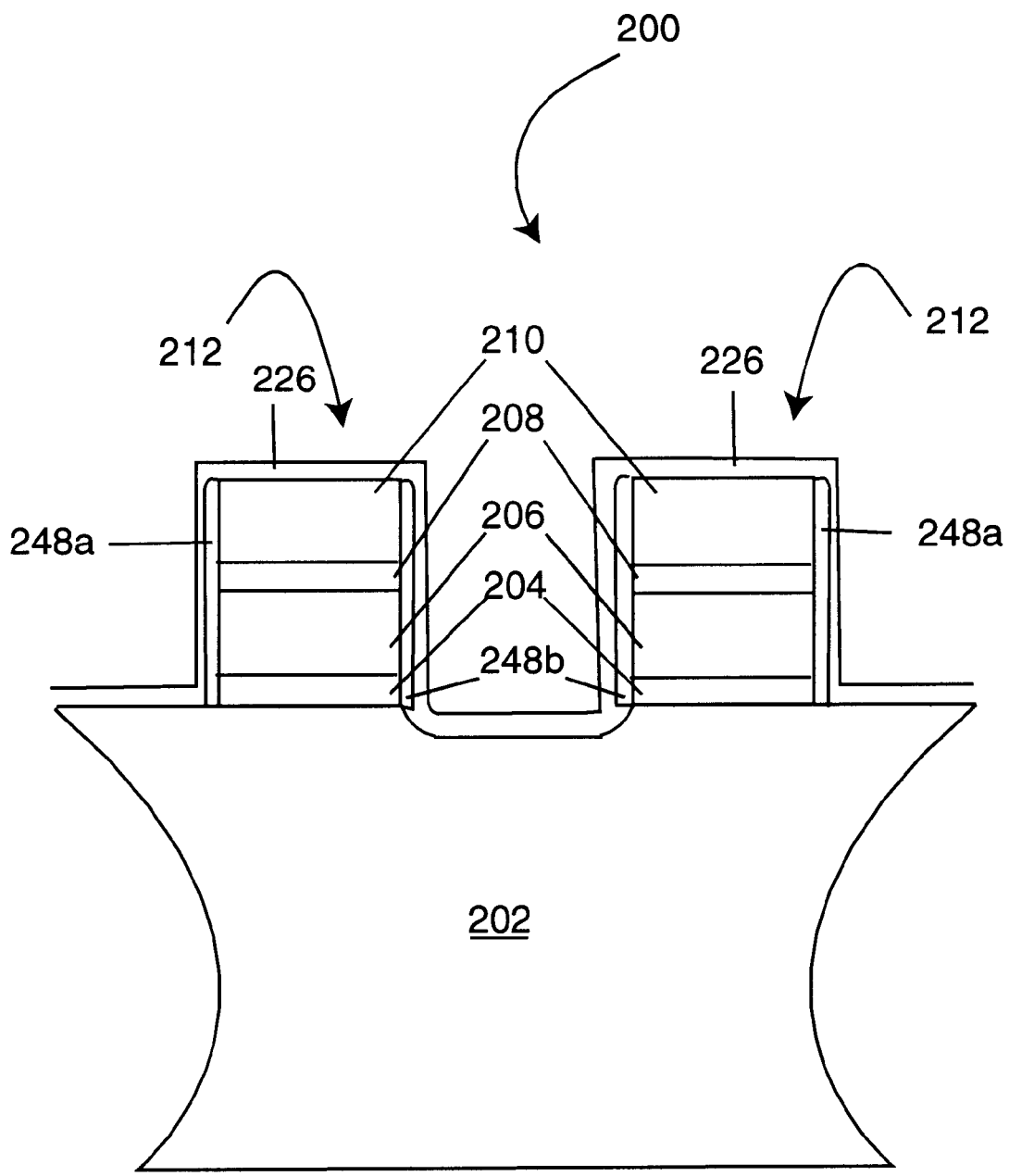
FIG. 6 illustrates the partially fabricated semiconductor device of FIG. 5 after blanket deposition of spacer oxide layer.

As shown in FIG. 6 a spacer oxide layer 226 is then deposited. Conventional methods well known in the art may be used to deposit spacer oxide layer 226. In the described embodiment, the spacer oxide layer may be between about 500 Å and about 1500 Å.

Figure 7:
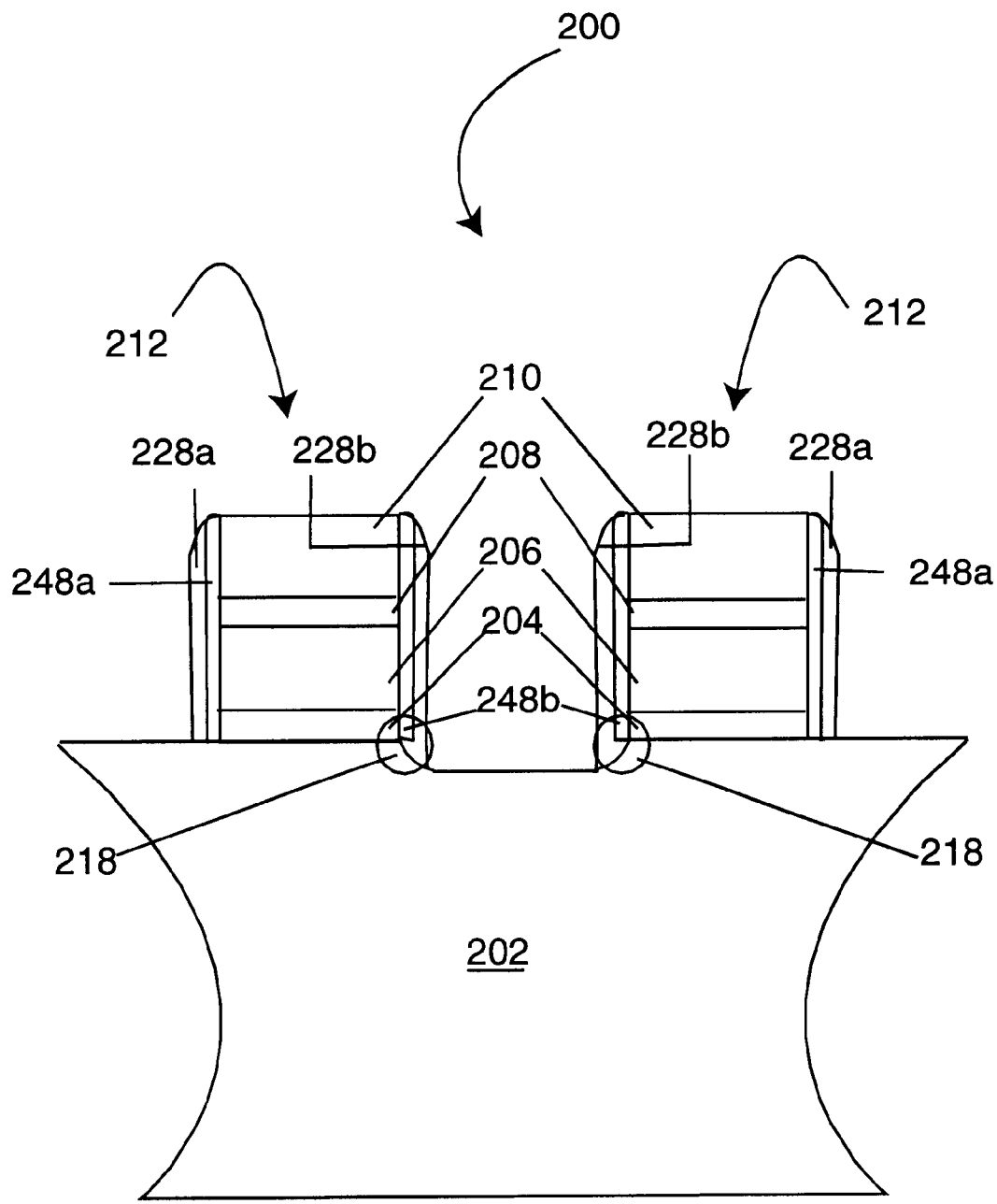
FIG. 7 illustrates the partially fabricated semiconductor device of FIG. 6 after spacer etch.

Anisotropic spacer etch, performed, for example, with conventional reactive ion etching (RIE), provides the partially fabricated semiconductor device shown in FIG. 7. Spacers 228a and 228b have been formed on the thin oxide layers 248a and 248b, which adhere to the sides of stacked gates 212. In the described embodiment, spacers 228a and 228b are between about 500 Å and about 1500 Å. Importantly, spacers 228b cover the gouged regions of the semiconductor substrate 218, the oxide layers 248a and 248b and the stacked gate edges. The presence of spacers 228a and 228b on the stacked gates significantly improves the uniformity of the subsequent source implant step, which reduces band to band tunneling leakage in source erase.

Figure 8:
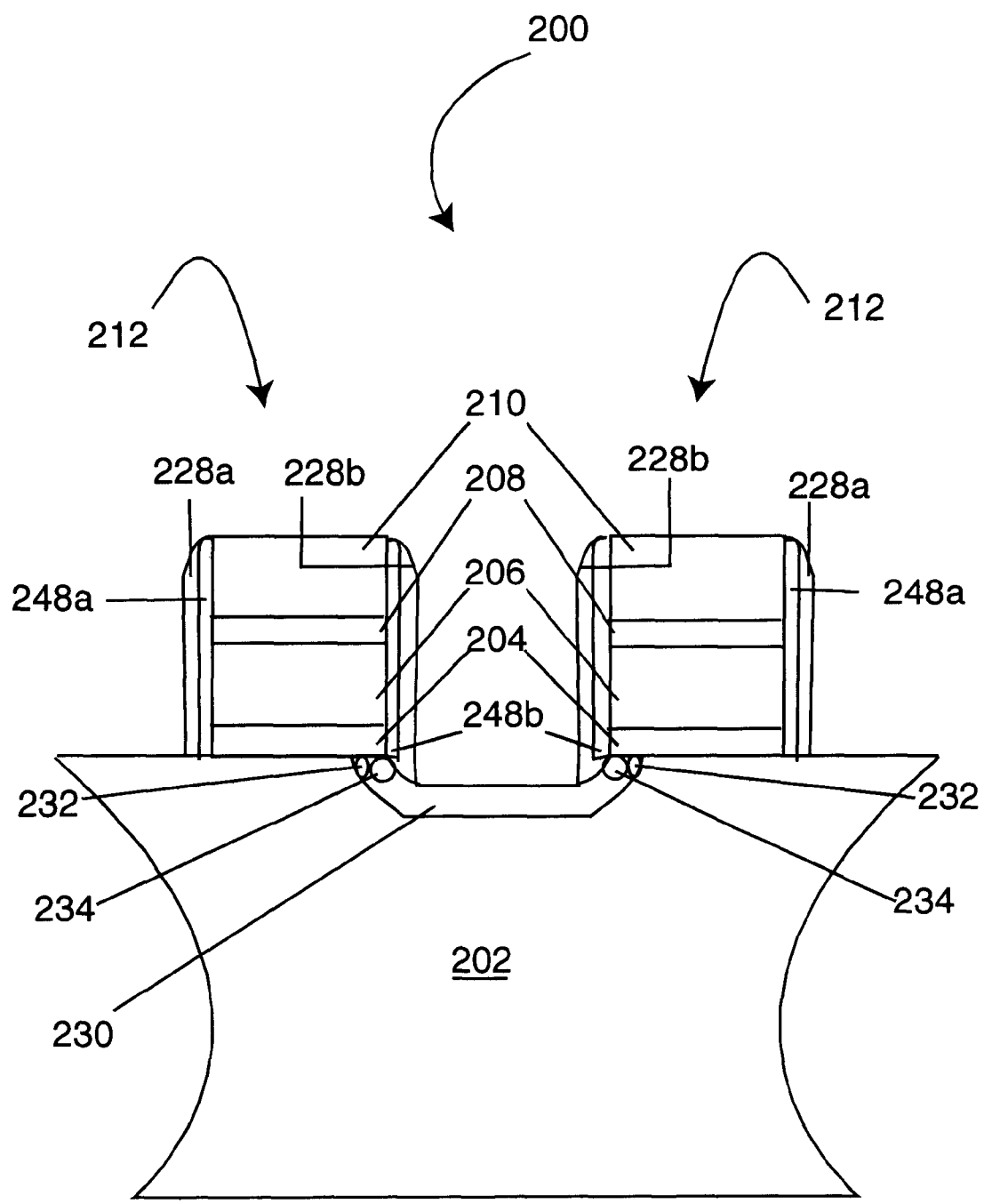
FIG. 8 illustrates the partially fabricated semiconductor device of FIG. 7 after SAS masking, source implant, annealing and SAS mask removal.

FIG. 8 illustrates partially fabricated semiconductor device 200 after SAS mask formation, source implant in the semiconductor substrate, annealing and removal of the SAS mask. SAS mask formation and removal are conventional steps well known in the art. In the described embodiment, the device is implanted with n-type dopant at various dosages ranging from between about $10^{14}$ ions/cm$^2$ to about $5 \times 10^{15}$/cm$^2$ (more preferably between about $5 \times 10^{14}$ ions/cm$^2$ to about $10^{15}$ ions/cm$^2$) at energies ranging from about 30 keV to about 60 keV (preferably about 30 keV) using conventional ion implantation equipment. In one embodiment, a tilted implant method is used to implant the source, which has the advantage of increasing the amount of implant diffusion under the sidewalls. Typically, the annealing step is performed between about 800° C. and about 1000° C. Preferably, the annealing step is performed at about 900° C.

Preferably, the implant is a phosphorus implant without any arsenic. Phosphorus implants are known to create fewer defects than arsenic within the crystal, which reduces source diode leakage.

The implanted semiconductor device depicted in FIG. 8 has source region 230 that has at least two doped regions 232 and 234 that differ in dopant concentration. The SAS line (also referred to as the source line) created by the implant has been displaced slightly relative to the stacked gates 212. More importantly, the SAS implant is self-aligned to the spacer and not the stacked gate edge. This is a significant advantage over the conventional process where the roughness of the stacked gate edge leads to non-uniform implant, which causes band to band tunneling leakage. The smooth surface of the spacer leads to a more uniform implant and consequently a superior junction profile.

Importantly, the present invention relies on diffusion of the implant under the spacer sidewalls to create two doped regions 232 and 234 in source region 230, which differ in dopant concentration. Region 234 is under the edge of stacked gates 212. Region 232 is adjacent to region 234 and is at the edge of source region 230 under stacked gates 212. Typically, the dopant concentration in region 232 is greater than the dopant concentration in region 234. In one embodiment, the dopant concentration in region 234 is about $1\times10^{19}$ atom/cm$^3$ while the dopant concentration in region 232 is about $5\times10^{19}$ atom/cm$^3$. Heavily doped region 232, which is displaced away from the stacked gate edge, directs electron flow to the stacked gate. Thus, leakage caused by the high field at the gate edge is reduced since electron flow is channeled through region 232, where the field is slightly lower and which is less damaged by stack gate etch and SAS etch.

Figure 9:
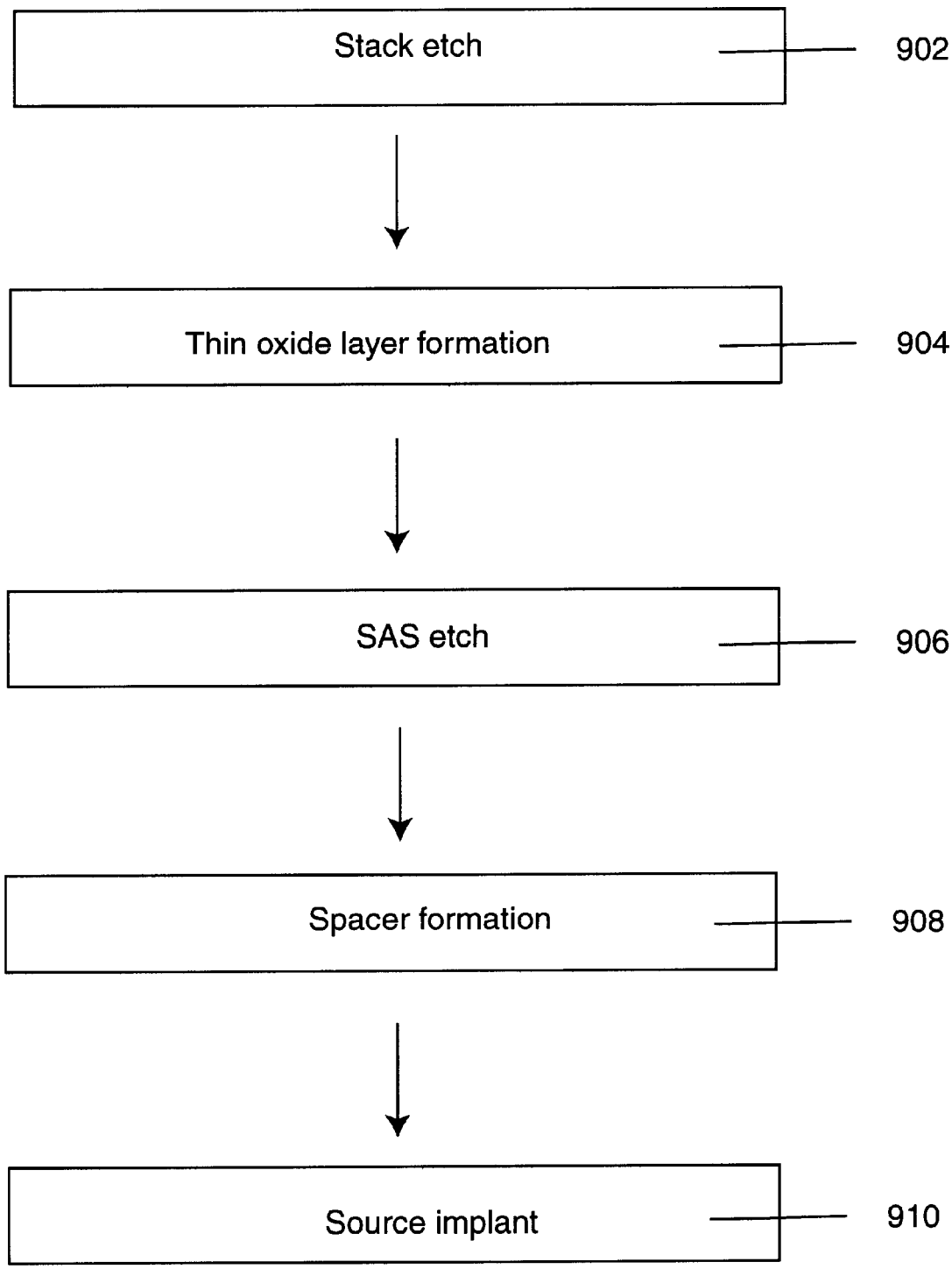
FIG. 9 summarizes the process sequence of a first embodiment of the present invention.

The described process sequence is summarized in FIG. 9. A partially fabricated semiconductor device made by methods well known to those of skill in the art is subjected to conventional stack etch at 902. A thin oxide layer is attached to the sides of the stacked gate at 904 by thin oxide deposition and anisotropic etch. SAS etch at 906, followed by spacer formation at 908 and source implant at 910 provides the partially fabricated semiconductor device illustrated FIG. 8.

The embodiment described above possesses a number of advantages over the prior art. First, because the implant is performed after spacer formation, a smoother junction is formed. Second, a more uniform implant is observed because the implant is self-aligned to the spacer rather than the gouged stack edge. Third, a region of high dopant concentration is located away from the stacked gate edge which was significantly damaged by SAS etch. Fourth, the implant may be a phosphorus implant that reduces crystal defects. The culmative effect of these aforementioned advantages is to provide a semiconductor device with reduced levels of leakage during source erase.

Figure 10:
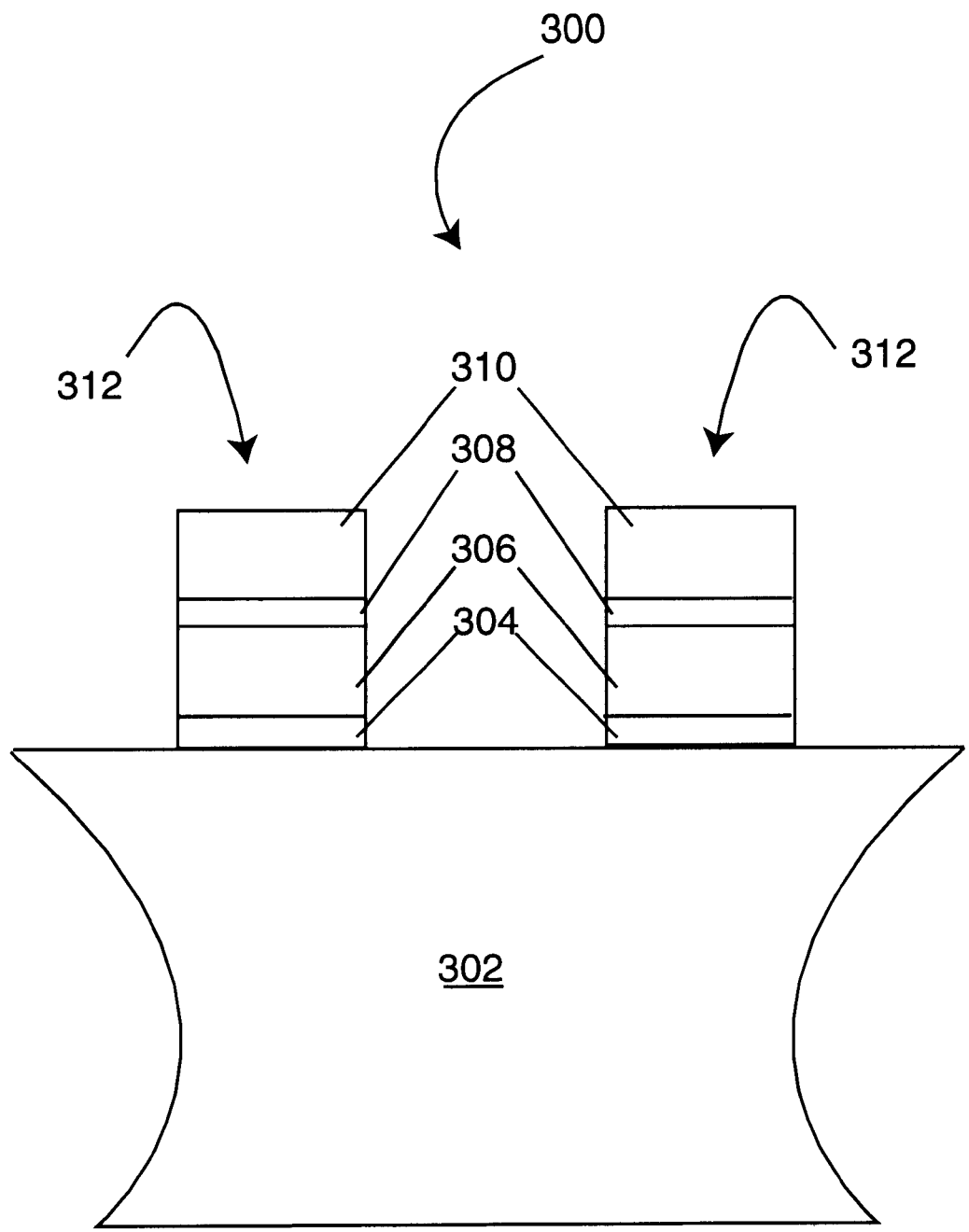
FIG. 10 illustrates a partially fabricated semiconductor device.

A second embodiment of the current invention begins with the partially fabricated semiconductor device 300 shown in FIG. 10. Stacked gates 312, disposed on semiconductor substrate 302 are formed by conventional stack etch. In one embodiment, the semiconductor substrate 302 may be a uniformly lightly p-doped single crystal silicon wafer. The channel length of the partially fabricated semiconductor device may be between about 0.25 μm and about 0.50 μm. Stacked gates 312 are comprised of a tunnel oxide layer 304, a first polysilicon layer 306, an ONO layer 308 and a second polysilicon layer 310. In the described embodiment, the tunnel oxide layer may be between 60 Å and about 100 Å, the first polysilicon layer may be between about 500 Å and about 1500 Å, the ONO layer may be between about 120 Å and about 200 Å and the second polysilicon layer may be between about 1000 Å and about 3000 Å.

Figure 11:
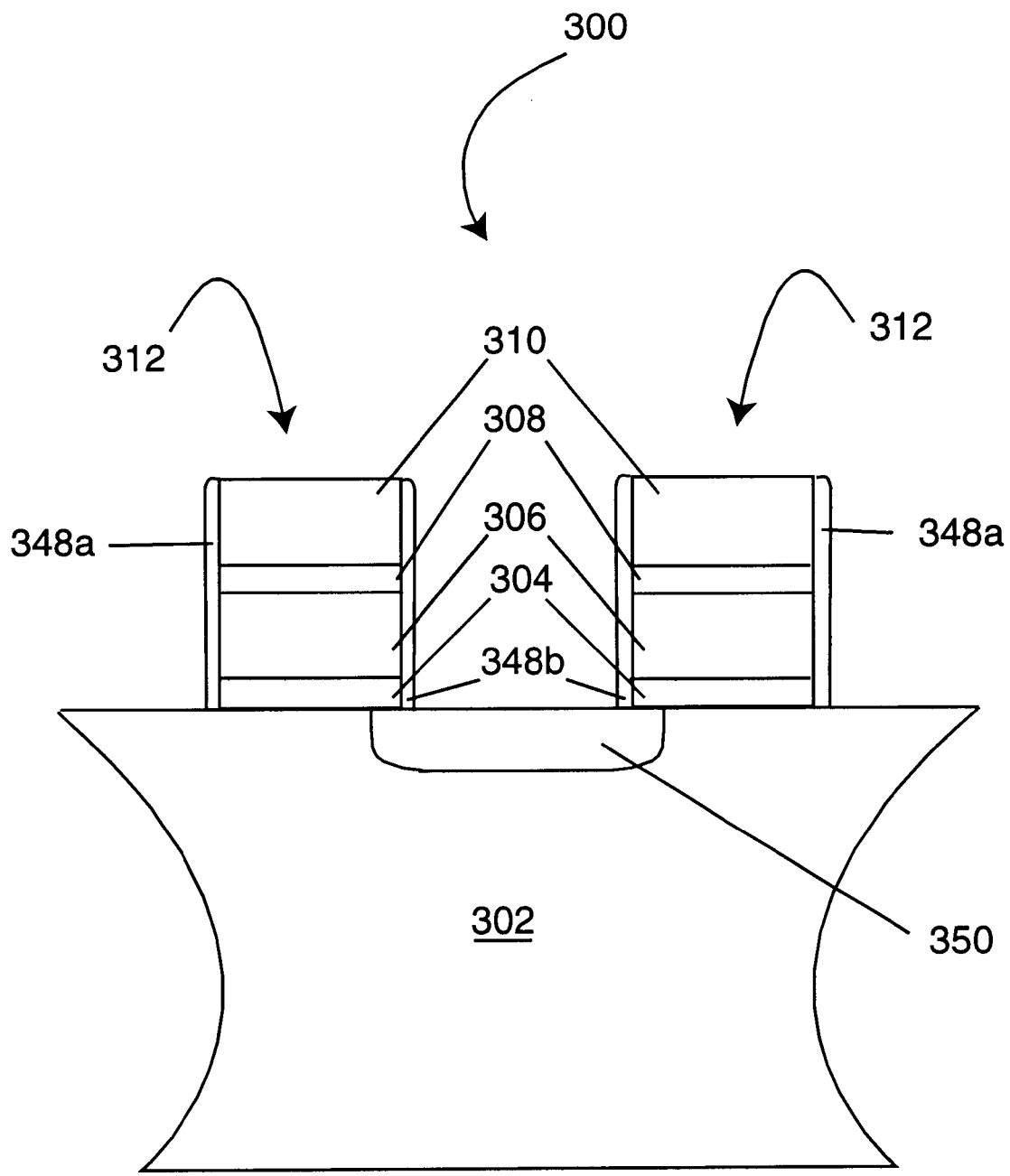
FIG. 11 illustrates the partially fabricated semiconductor device of FIG. 10 after SAS masking, a first source implant, SAS mask removal, annealing and oxidation, blanket deposition of a first oxide layer and oxide etch.

The following sequence of process steps provides the partially fabricated semiconductor device shown in FIG. 11 from the structure depicted in FIG. 10: SAS masking, a first source implant, annealing and oxidation, SAS mask removal, deposition of a first oxide layer and anisotropic etch of the first oxide layer. First oxide layers 348a and 348b have been appended to the edges of stacked gates 312 and source region 350 has been formed. Source region 350 is preferably implanted with phosphorus.

In one embodiment, the first source implant is preferably phosphorus at various dosages ranging from between about $10^{14}$ ions/cm$^2$ to about $5\times10^{15}$ ions/cm$^2$ (more preferably between about $10^{15}$ ions/cm$^2$ to about $2\times10^{15}$ ions/cm$^2$) at energies ranging from about 40 keV to about 60 keV (preferably about 50 keV) using conventional ion implantation equipment. Typically, the annealing step is performed between about 800° C. and about 1000° C. Preferably, the annealing step is performed at about 900° C.

In the described embodiment, the first oxide layer may be between 100 Å and about 500 Å. The first oxide layer ensures good sidewall sealing for the ONO layer 308 and tunnel oxide layer 304. The first oxide layer is sometimes called the seal oxide.

Figure 12:
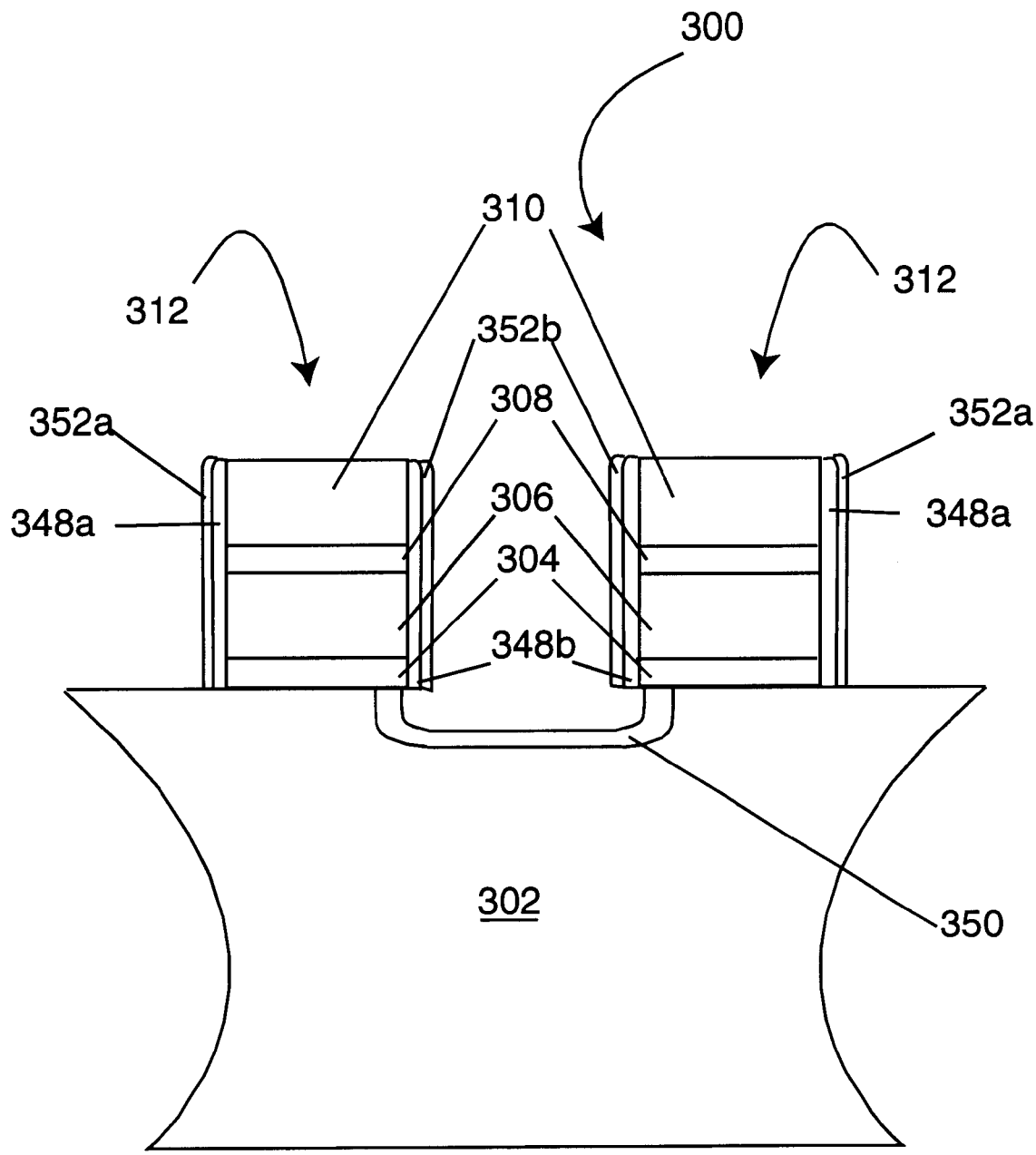
FIG. 12 illustrates the partially fabricated semiconductor device of FIG. 11 after growth of a second oxide layer on the first oxide layer, SAS masking, SAS etch and SAS mask removal.

Growth of second oxide layers 352a and 352b on first oxide layers 348a and 348b followed by the conventional process sequence of SAS masking, SAS etch and mask removal provides the partially fabricated semiconductor device shown in FIG. 12. In one embodiment, the second oxide layer may be between 50 Å and about 100 Å. The second oxide layer reduces the damage to the tunnel oxide since the first oxide layer may not sufficiently protect layer 304 during SAS etch. Note that the top portion of source region 350 has been removed by SAS etch which negatively affects subsequent performance.

Figure 13:
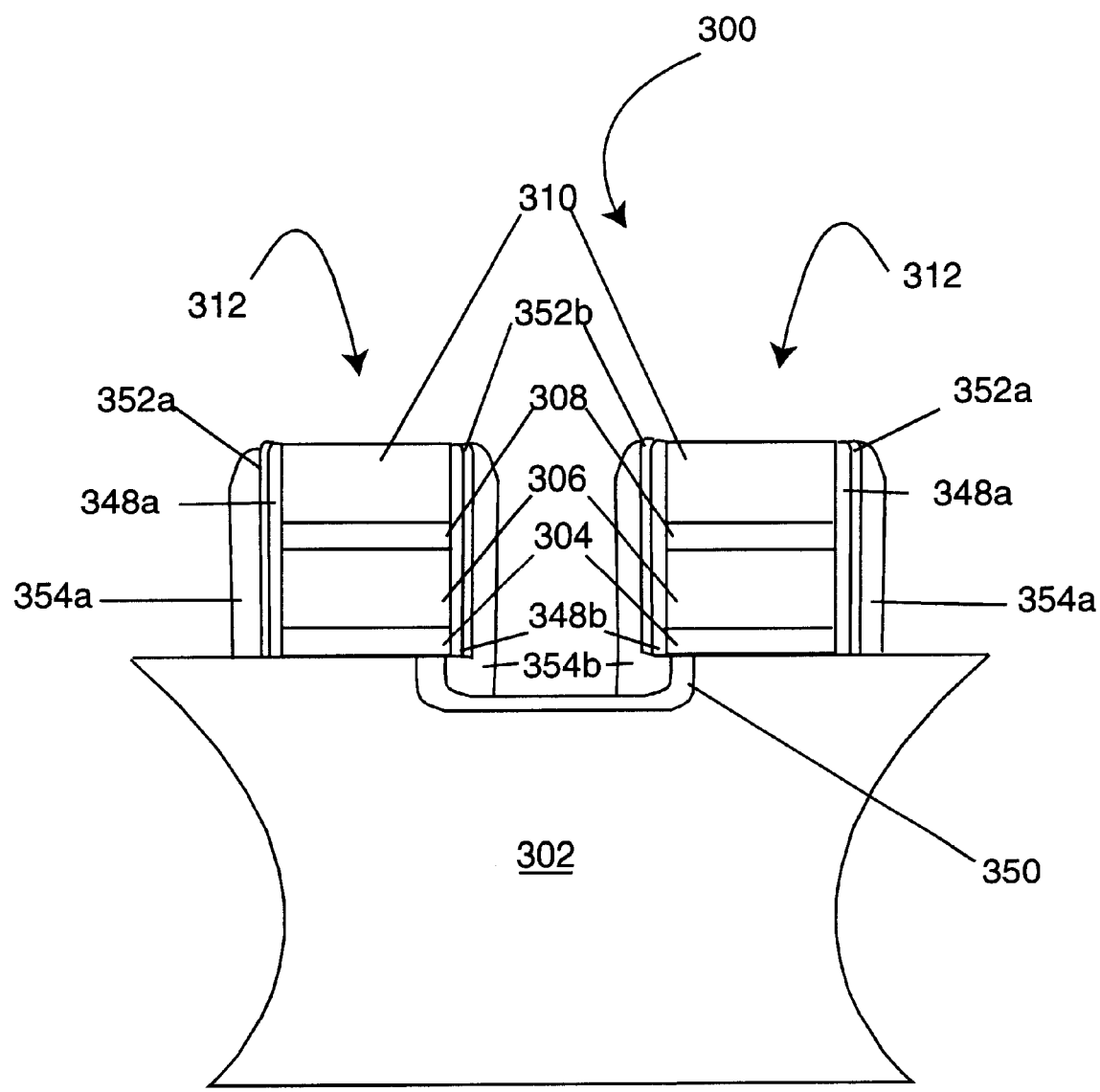
FIG. 13 illustrates the partially fabricated semiconductor device of FIG. 12 after blanket deposition of spacer and spacer etch.

FIG. 13 illustrates the partially fabricated semiconductor device of FIG. 12 after spacer deposition and anisotropic etch of the spacer layer. Note that spacer layers 354a and 354b have been formed on top of second oxide layers 352a and 352b on the edge of stacked gates 312. In the exemplified embodiment, the spacer may be between about 500 Å and about 1500 Å.

Figure 14A:
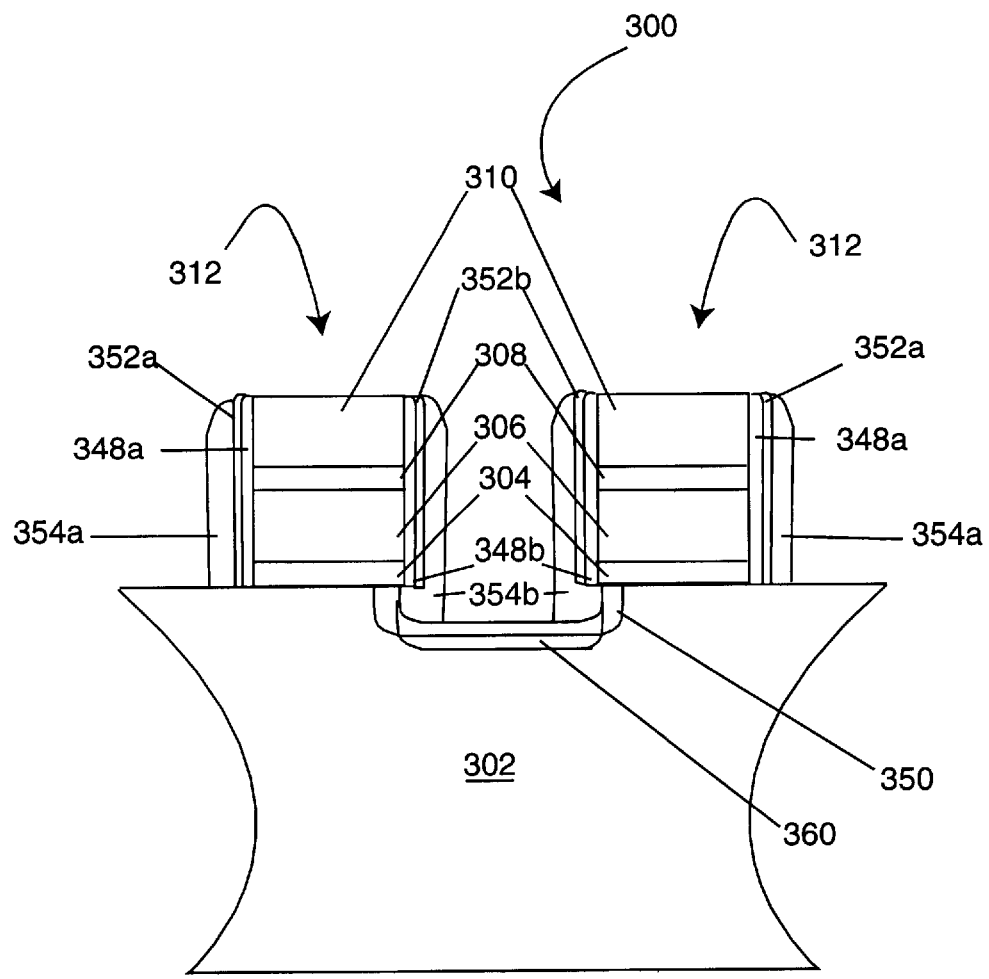
FIG. 14A illustrates the partially fabricated semiconductor device of FIG. 13 after SAS masking, a second source implant and SAS mask removal.

The sequential steps of SAS masking, source implant and SAS mask removal provide the structure illustrated in FIG. 14A. In one embodiment, the source implant may be a n-type dopant (preferably phosphorus) at various dosages ranging from between about $10^{15}$ ions/cm$^2$ to about $10^{16}$/cm$^2$ (more preferably between about $3\times10^{15}$ ions/cm$^2$ to about $5\times10^{15}$ ions/cm$^2$) at energies ranging from about 30 keV to about 60 keV (preferably about 40 keV) using conventional ion implantation equipment. The source implant forms a second source region 360 which overlaps the first source region 350.

Figure 14B:
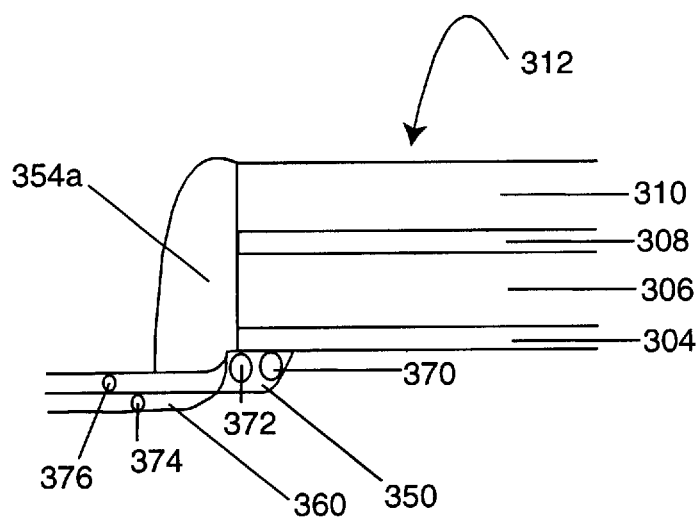
FIG. 14B illustrates an enlarged view of stacked gate edge and source implant regions depicted in FIG. 14A.

FIG. 14B illustrates an enlarged view of the stacked gate edge and source implant regions depicted in FIG. 14A. Oxide layers 352 and 348 are not shown on the edge of stacked gate 312 for the sake of clarity. The first source implant region 350 and the second source implant region 360 are located below the spacer 354 and the edge of the stacked gate.

Region 370 at the edge of source implant region 350 under the stacked gate has a dopant concentration of between about $5\times10^{19}$ atoms/cm$^3$ and about $1\times10^{20}$ atoms/cm$^3$. Region 372 directly under the edge of the stacked gate in source implant area 350 has a dopant concentration of between about $10^{19}$ atoms/cm$^3$ and about $5\times10^{19}$ atoms/cm$^3$. Region 374 in source region 360 has a dopant concentration of between about $10^{18}$ atoms/cm$^3$ and about $10^{19}$ atoms/cm$^3$. Finally, region 376 in source region 370 has a dopant concentration of between about $10^{20}$ atoms/cm$^3$ and about $5\times10^{20}$ atoms/cm$^3$. It should be understood that the dopant concentration in regions 370, 372, 374 and 376 might differ from the values provided above. However, the dopant concentration pattern using the method of the current invention will approximate the dopant distribution shown in FIG. 14B.

Heavily doped region 370, which is displaced away from the stacked gate edge, directs electron flow to the stacked gate. Thus, leakage caused by the high field at the gate edge is reduced since electron flow is channeled through region 370, where the field is slightly lower and which is less damaged by stack gate etch and SAS etch.

Figure 15:
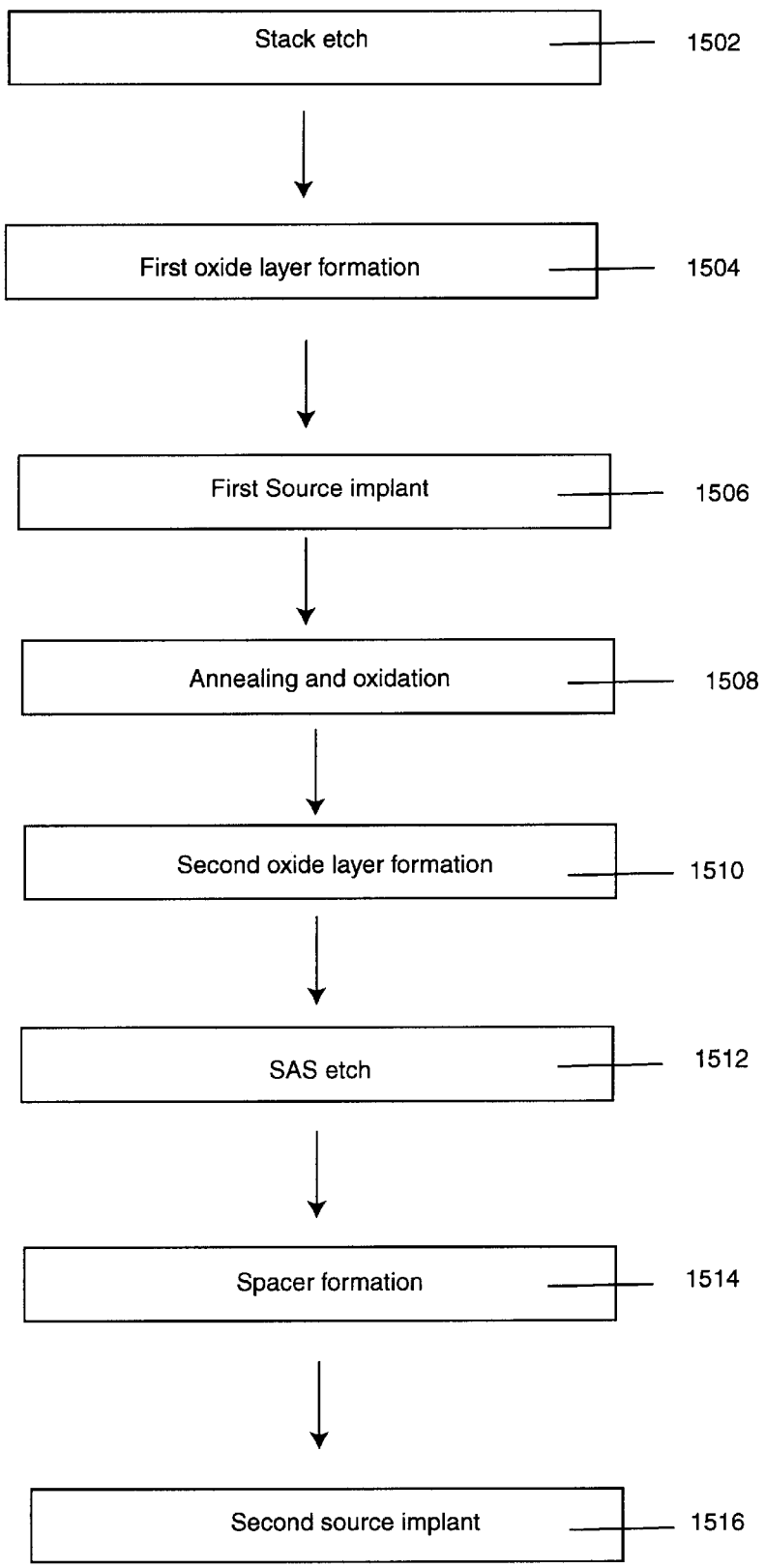
FIG. 15 summarizes the process sequence of a second embodiment of the present invention.

The described process sequence is summarized in FIG. 15. A partially fabricated semiconductor device, made by methods well known to those of skill in the art, is subjected to conventional stack etch at 1502. A first oxide layer is attached to the sides of the stacked gate at 1504 by first oxide deposition and anisotropic etch. A first source implant is performed at 1506 followed by annealing and oxidation at 1508. Formation of a second oxide layer at 1510, followed by SAS etch at 1512 and spacer formation at 1514 and a second source implant at 1516 provides the partially fabricated semiconductor device illustrated in FIG. 14A.

The described embodiment has some significant advantages over the prior art. Because the first source implant is performed before SAS etch and the second source implant is performed after spacer formation, a smoother junction is formed under the stacked gate. Second, a more uniform implant is observed because the second source implant is self aligned to the spacer rather than the gouged stack edge. Preferably, the first source implant is a phosphorus implant which causes less crystal defects. The region of high dopant concentration 370 under the stacked gate is located away from the stacked gate edge which is damaged by SAS etch. These aforementioned advantages provide a semiconductor device with reduced levels of leakage during source erase.

Although the foregoing invention has been described in some detail for purposes of clarity of understanding, it will be apparent that certain changes and modifications may be practiced within the scope of the appended claims.

Furthermore, it should be noted that there are alternative ways of implementing both the process and apparatus of the present invention. For example, the semiconductor substrate may be a lightly doped n-type silicon wafer. The semiconductor device may then be implanted with a p-type dopant. The source regions adjacent to the stacked gate may have different dopant concentrations than those mentioned in the described embodiments. Accordingly, the present embodiments are to be considered as illustrative and not restrictive, and the invention is not to be limited to the details given herein, but may be modified within the scope and equivalents of the appended claims.

What is claimed is:

1. A semiconductor device comprising:
   a stacked gate provided on a portion of a semiconductor substrate;
   a first oxide layer provided on the edge of the stacked gate;
   a spacer provided adjacent the first oxide layer; and
   a doped source region, the source region having a first doped region disposed under the edge of the stacked gate and a second doped region disposed at the edge of the doped source region under the stacked gate;
   wherein the second doped region has a higher concentration of dopant than the first doped region, whereby source leakage of the semiconductor device is reduced.

2. The semiconductor device of claim 1, wherein the second doped region has a dopant concentration of about $10^{20}$ atoms/cm$^3$ and the first doped region has a dopant concentration of about $5\times10^{19}$ atoms/cm$^3$.

3. The semiconductor device of claim 1, wherein the stacked gate comprises:
   a tunnel oxide layer disposed on the semiconductor substrate;
   a first polysilicon layer disposed on the tunnel oxide layer;
   a ONO layer disposed on the first polysilicon layer; and
   a second polysilicon layer disposed on the ONO layer.

4. The semiconductor device of claim 3, wherein the tunnel oxide layer is between about 60 Å and about 100 Å.

5. The semiconductor device of claim 3, wherein the first polysilicon layer is between about 500 Å and about 1500 Å.

6. The semiconductor device of claim 3, wherein the second polysilicon layer is between about 1000 Å and about 3000 Å.

7. The semiconductor device of claim 3, wherein the ONO layer is between about 120 Å and about 200 Å.

8. The semiconductor device of claim 1, wherein the first oxide layer is between about 100 Å and about 500 Å.

9. The semiconductor device of claim 1, wherein the channel length of the semiconductor device is between about 0.25 µm and about 0.50 µm.

10. The semiconductor device of claim 1, wherein the spacer is between about 500 Å and about 1500 Å.

11. The semiconductor device of claim 1 wherein the doped source region is doped with phosphorus.

12. A semiconductor device comprising:
    a stacked gate provided on a portion of a semiconductor substrate;
    a first oxide layer provided on the edge of the stacked gate;
    a second oxide layer provided adjacent the first oxide layer;
    a spacer provided adjacent the second oxide layer; and
    a doped source region, the source region having a first doped region disposed under the edge of the stacked gate and a second doped region disposed at the edge of the doped source region under the stacked gate;
    wherein the second doped region has a higher concentration of dopant than the first doped region, whereby source leakage of the semiconductor device is reduced.

13. The semiconductor device of claim 12, wherein the second doped region has a dopant concentration of about $5\times10^{19}$ atoms/cm$^3$ and the first doped region has a dopant concentration of about $1\times10^{19}$ atoms/cm$^3$.

14. The semiconductor device of claim 12, wherein the stacked gate comprises:
    a tunnel oxide layer disposed on the semiconductor substrate;
    a first polysilicon layer disposed on the tunnel oxide layer;
    a ONO layer disposed on the first polysilicon layer; and
    a second polysilicon layer disposed on the ONO layer.

15. The semiconductor device of claim 12, wherein the channel length of the semiconductor device is between about 0.25 µm and about 0.50 µm.

16. The semiconductor device of claim 12, wherein the doped source region is doped with phosphorus.

17. The semiconductor device of claim 12, wherein the second oxide layer is between about 50 Å and about 100 Å.

* * * * *